US011681903B2

(12) United States Patent
Vasanthakumaribabu et al.

(10) Patent No.: US 11,681,903 B2
(45) Date of Patent: Jun. 20, 2023

(54) SPIKE DETECTION IN MEMRISTOR CROSSBAR ARRAY IMPLEMENTATIONS OF SPIKING NEURAL NETWORKS

(71) Applicant: Micron Technology, Inc., Boise, ID (US)

(72) Inventors: Anakha Vasanthakumaribabu, Jersey City, NJ (US); Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 606 days.

(21) Appl. No.: 16/669,902

(22) Filed: Oct. 31, 2019

(65) Prior Publication Data
US 2021/0133541 A1 May 6, 2021

(51) Int. Cl.
*G06N 3/063* (2023.01)
*G11C 13/00* (2006.01)
*G06N 3/049* (2023.01)

(52) U.S. Cl.
CPC ............ *G06N 3/063* (2013.01); *G06N 3/049* (2013.01); *G11C 13/0026* (2013.01); *G11C 13/0028* (2013.01)

(58) Field of Classification Search
CPC .......... G06N 3/02; G06N 3/04; G06N 3/0454; G06N 3/049; G06N 3/06; G06N 3/063
See application file for complete search history.

(56) References Cited

U.S. PATENT DOCUMENTS

| 9,847,124 B2 * | 12/2017 | Hu ........................... G06N 7/01 |
| 10,141,716 B1 | 11/2018 | Lenius et al. |
| 10,421,453 B1 | 9/2019 | Ferguson et al. |

(Continued)

FOREIGN PATENT DOCUMENTS

| GB | 2536043 | 9/2016 |
| GB | 2597070 | 1/2022 |

(Continued)

OTHER PUBLICATIONS

Memristor-based fine resolution programmable resistance and its applications, by Shin (Year: 2009).*

(Continued)

*Primary Examiner* — Thomas Fink
(74) *Attorney, Agent, or Firm* — Greenberg Traurig (57) ABSTRACT

Systems, methods and apparatus of implementing spiking neural networks. For example, an integrated circuit includes a crossbar array of first memristors connected between wordlines and bitlines. The first memristors are configured to convert voltages applied on the wordlines into currents in the bitlines. Second memristors having thresholds are connected to the bitlines respectively. Each respective memristor in the second memristors can reduce its resistance to cause spiking in a current flowing through the respective memristor, when the current reaches the threshold of the respective memristor. Current level detectors are connected to the second memristors to determine whether the currents in the bitlines have levels corresponding to reaching thresholds of the second memristors and thus, generate output spikes of spiking neurons without using analog-to-digital converters to measure the currents in the bitlines.

20 Claims, 5 Drawing Sheets

(56) References Cited

U.S. PATENT DOCUMENTS

| | | |
|---|---|---|
| 11,351,991 B2 | 6/2022 | Ghafarianzadeh et al. |
| 11,378,965 B2 | 7/2022 | Codevilla et al. |
| 11,385,642 B2 | 7/2022 | Haggblade et al. |
| 2014/0081893 A1 | 3/2014 | Modha |
| 2017/0221560 A1* | 8/2017 | Hu .................. G06G 7/122 |
| 2018/0057314 A1 | 3/2018 | Martin et al. |
| 2018/0225562 A1 | 8/2018 | Van Der |
| 2018/0301729 A1 | 10/2018 | Havansi |
| 2019/0025094 A1 | 1/2019 | Lewis et al. |
| 2019/0057314 A1 | 2/2019 | Julian et al. |
| 2019/0138894 A1* | 5/2019 | Yakopcic ............... G06F 17/10 |
| 2019/0279366 A1 | 9/2019 | Sick et al. |
| 2019/0324205 A1 | 10/2019 | Sharma et al. |
| 2019/0387185 A1 | 12/2019 | Hicks |
| 2019/0391251 A1 | 12/2019 | Bharadwaj, Jr. et al. |
| 2020/0175315 A1 | 6/2020 | Gowaikar et al. |
| 2020/0209864 A1 | 7/2020 | Chen |
| 2020/0326718 A1 | 10/2020 | Kandemir et al. |
| 2021/0190913 A1 | 6/2021 | Vasanthakumaribabu et al. |
| 2021/0215753 A1 | 7/2021 | Price et al. |
| 2021/0255637 A1 | 8/2021 | Kale et al. |
| 2021/0326687 A1* | 10/2021 | Liu ..................... G06N 3/0454 |
| 2021/0381960 A1 | 12/2021 | Na et al. |
| 2022/0026540 A1 | 1/2022 | Olivier |
| 2022/0026573 A1 | 1/2022 | Baribault et al. |
| 2022/0026576 A1 | 1/2022 | Baribault et al. |

FOREIGN PATENT DOCUMENTS

| | | | |
|---|---|---|---|
| WO | WO-2020133463 A1 * | 7/2020 | ........... G06N 3/0635 |
| WO | 2021138358 | 7/2021 | |

OTHER PUBLICATIONS

Chantelle Dubois, "What Is Solid State LiDAR and Is It Faster, Cheaper, Better?", https://www.allaboutcircuits.com/news/solid-state-lidar-faster-cheaper-better/, 2018.

Lidar, Wikipedia, printed on Oct. 31, 2019.

Philip E. Ross, "Lumotive Says It's Got a Solid-State Lidar That Really Works", IEEE Spectrum, https://spectrum.ieee.org/cars-that-think/transportation/sensors/lumotive-says-its-got-a-solidstate-lidar-that-really-works. Mar. 21, 2019.

Tianqi Tang, et al.: "Spiking Neural Network with RRAM: Can We Use it for Real-World Application?", 2015 Design, Automation, and Test in Europe Conference & Exhibition, pp. 860-865, 2015.

Gennadi Bersuker, et al.: "Metal Oxide RRAM Switching Mechanism Based on Conductive Filament Properties", Journal of Applied Physics 110(12):124518, Dec. 2012.

Shayer, Oran, et al. "Learning Discrete Weights Using the Local Reparameterization Trick." Cornell University, Feb. 2, 2018.

Xia, Qiangfei, et al. "Memristive crossbar arrays for brain-inspired computing." Retrieved from the Internet on Jul. 29, 2022: <https://www.nature.com/articles/s41563-019-0291-x>, Mar. 20, 2019.

* cited by examiner

SPIKE DETECTION IN MEMRISTOR CROSSBAR ARRAY IMPLEMENTATIONS OF SPIKING NEURAL NETWORKS

FIELD OF THE TECHNOLOGY

At least some embodiments disclosed herein relate to artificial neural network in general and more particularly, but not limited to, memristor crossbar array implementations of spiking neural networks.

BACKGROUND

In general, an Artificial Neural Network (ANN) uses a network of artificial neurons to process inputs to the network and to generate outputs from the network.

For example, each neuron in the network receives a set of inputs. Some of the inputs to a neuron may be the outputs of certain neurons in the network; and some of the inputs to a neuron may be the inputs provided to the neural network. The input/output relations among the neurons in the network represent the neuron connectivity in the network.

For example, each neuron can have a bias, an activation function, and a set of synaptic weights for its inputs respectively. The activation function may be in the form of a step function, a linear function, a log-sigmoid function, etc. Different neurons in the network may have different activation functions.

For example, each neuron can generate a weighted sum of its inputs and its bias and then produce an output that is the function of the weighted sum, computed using the activation function of the neuron.

The relations between the input(s) and the output(s) of an ANN in general are defined by an ANN model that includes the data representing the connectivity of the neurons in the network, as well as the bias, activation function, and synaptic weights of each neuron. Using a given ANN model a computing device computes the output(s) of the network from a given set of inputs to the network.

For example, the inputs to an ANN network may be generated based on camera inputs; and the outputs from the ANN network may be the identification of an item, such as an event or an object.

A Spiking Neural Network (SNN) is a type of ANN that closely mimics natural neural networks. An SNN neuron produces a spike as output when the activation level of the neuron is sufficiently high. The activation level of an SNN neuron mimics the membrane potential of a natural neuron. The outputs/spikes of the SNN neurons can change the activation levels of other neurons that receive the outputs. The current activation level of an SNN neuron as a function of time can be modeled using a differential equation and considered the state of the SNN neuron. Incoming spikes from other neurons can push the activation level of the neuron higher to reach a threshold for spiking. Once the neuron spikes, its activation level is reset. Before the spiking, the activation level of the SNN neuron can decay over time, as controlled by the differential equation. The element of time in the behavior of SNN neurons makes an SNN suitable for processing spatiotemporal data. The connectivity of SNN is often sparse, which is advantageous in reducing computational workload.

In general, an ANN may be trained using a supervised method where the parameters in the ANN are adjusted to minimize or reduce the error between known outputs resulted from respective inputs and computed outputs generated from applying the inputs to the ANN. Examples of supervised learning/training methods include reinforcement learning, and learning with error correction.

Alternatively, or in combination, an ANN may be trained using an unsupervised method where the exact outputs resulted from a given set of inputs is not known before the completion of the training. The ANN can be trained to classify an item into a plurality of categories, or data points into clusters.

Multiple training algorithms can be employed for a sophisticated machine learning/training paradigm.

BRIEF DESCRIPTION OF THE DRAWINGS

The embodiments are illustrated by way of example and not limitation in the figures of the accompanying drawings in which like references indicate similar elements.

DETAILED DESCRIPTION

At least some embodiments disclosed herein provide systems, methods and apparatus to implement a spiking neural network using one or more memristor crossbar arrays without using analog-to-digital converters in detecting spikes.

Resistive Random-Access Memory (ReRAM or RRAM) works by changing the resistance across a dielectric solid-state material, which can be referred to as a memristor. In general, a memristor is a two-terminal electrical component that has a non-constant electrical resistance. Its resistance can change based on the history of current flowing through the memristor and/or the history of voltage applied on the memristor. The memristor can remember its recent resistance when the power supply to the memristor is turned off. Thus, the memristor can be used to implement non-volatile memory.

At least some embodiments disclosed herein provide efficient implementations of Multiply-and-Accumulate (MAC) operations for Spiking Neural Networks (SNN). A crossbar array of memristors can be configured to perform the Multiply-and-Accumulate (MAC) operations via analog circuitry. Electric currents going through the wordlines through a set of memristors in the crossbar array to a bitline are summed in the bitline, which corresponds to the accumulation operation. The electric currents correspond to the multiplication of the voltages applied on the wordlines and parameters associated with the resistances of the memristors, which corresponds to the multiplication operations. The current in the bitline can be compared with a spiking threshold to determine whether the activation level of a neuron represented by the bitline has reached a spiking level. An array of memristors can be connected to the bitlines respectively and programmed to have thresholds corresponding to the activation level thresholds of spiking neurons. A current detector can be configured for each memristor connected to the output of a bitline to determine whether the level of electric current in the bitline corresponding to a level that exceeds the threshold of the memristor. The detection result of the current detector can represent the spiking response in the output of a spiking neuron represented by the bitline. The spiking response can be routed to a further portion of the SNN or to an output of the SNN.

Alternatively, Analog-to-Digital Converters (ADCs) can be used to measure and convert the electric currents in the bitlines into digital data for spiking detection in a comparator. However, ADCs consume more space and energy than memristors and current detectors. Thus, the use of the array of memristors and current detectors in detecting spiking to eliminate the need for ADCs can improve the space and energy efficiency of the SNN implementation.

Figure 1:
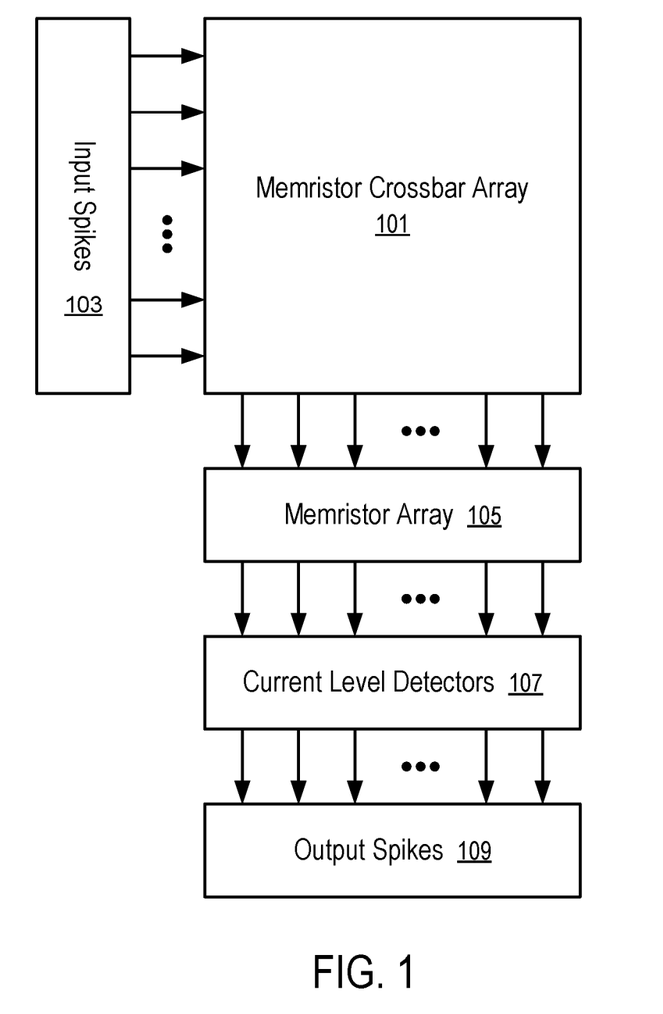
FIG. 1 shows a tile of spiking neural network implemented using memristors according to one embodiment.

FIG. 1 shows a tile of spiking neural network implemented using memristors according to one embodiment.

In FIG. 1, a memristor crossbar array (101) receives input voltage spikes (103) to generate electric currents going through the memristor array (105) that can function as an array of switches. Each memristor in the array (105) is programmed to have a threshold for spiking detection. When the electric current flowing through the memristor is lower than the threshold, the memristor has a substantially same electrical resistance; and the switch implemented via the memristor is considered to be in an off state. However, when the electric current flowing through the memristor reaches its threshold, the electrical resistance of the memristor drops (e.g., close to zero), causing the current flowing through the memristor to increase significantly and spike; and in such a situation, the switch implemented via the memristor is considered to be in an on state. Once the switch implemented via the memristor is in the on state, the current flowing through the memristor can increase to at least a predefined level that is independent of the threshold of the memristor and that is higher than the currents that can flow through the memristors in the array (101) before reaching the thresholds of the memristors in the array (101).

An array of current level detectors (107) can be configured to detect whether currents flowing through the memristors in the array (105) have reached the levels corresponding to the switch-on state of the memristors in the array (105). The detection can be performed based on detecting whether at least the predefined level of current is flowing through the corresponding memristors in the array (105). Thus, the current detection operations of the current level detectors (107) are independent on the thresholds of the memristors in the array (105). Based on whether or not at least the predefined level of current is present in a memristor in the array, a corresponding detector in the array of current level detectors (107) generates a digital signal indicating whether a spike in electric current is detected for a memristor in the array (105). The collection of the outputs from the current level detectors (107) provides the output spikes (109).

Figure 2:
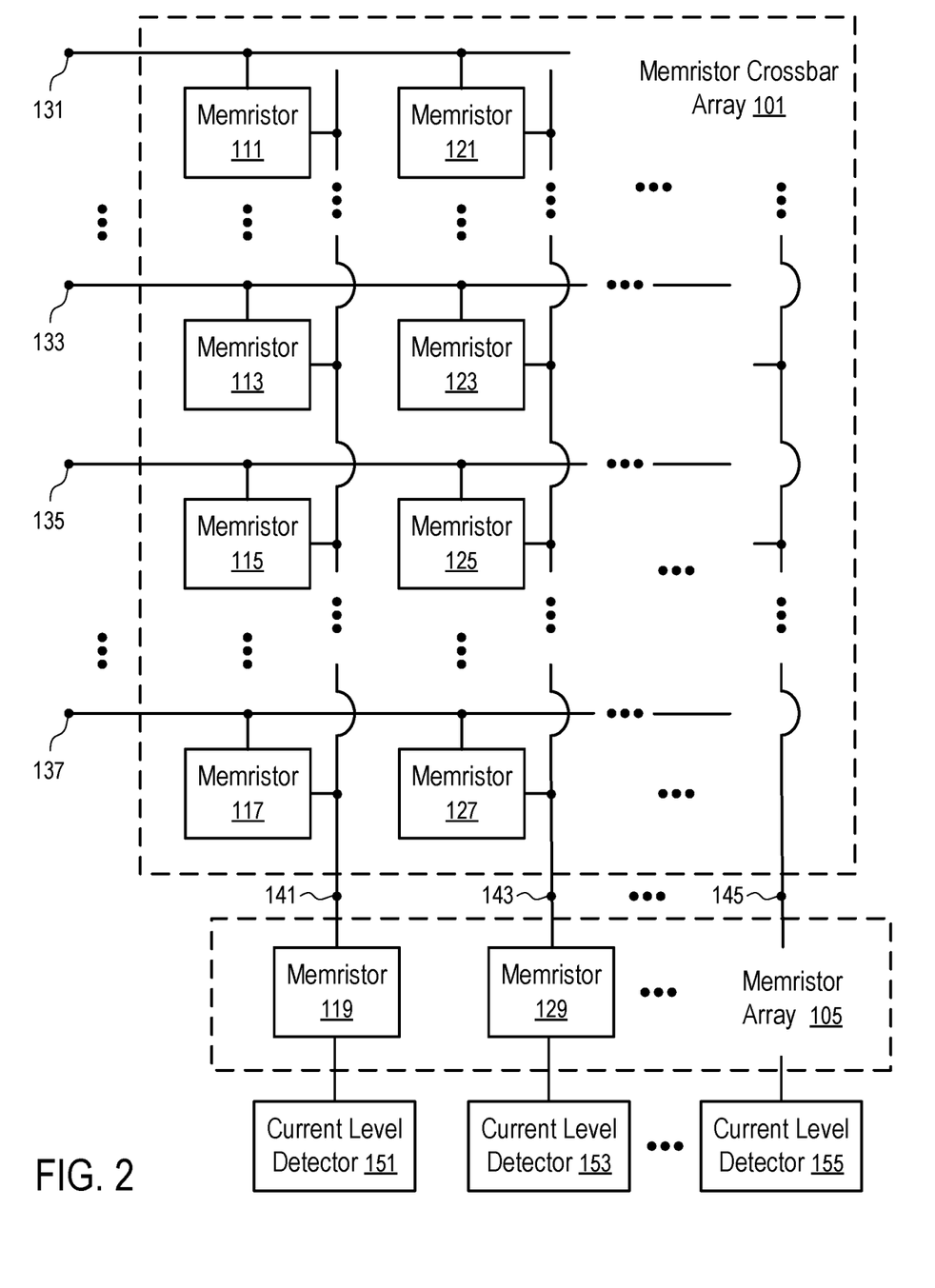
FIG. 2 illustrates the use of current spikes through a memristor array to detect spiking in a spiking neural network implemented using memristors according to one embodiment.

FIG. 2 illustrates the use of current spikes through a memristor array to detect spiking in a spiking neural network implemented using memristors according to one embodiment. For example, the crossbar array (101) and the memristor array (105) of FIG. 1 can be implemented in a way as illustrated in FIG. 2.

In FIG. 2, each of the memristors in the crossbar array (101) are connected between a wordline (e.g., 131) and a bitline (e.g., 141). The wordlines (131, . . . , 133, 135, . . . , 137) are configured to receive input voltages; the bitlines (141, 143, . . . , 145) are configured to provide output currents; and the memristor array (105) is configured to generate, according to activation level thresholds of spiking neurons, output current spikes corresponding to the spiking of neurons represented by the bitlines (141, 143, . . . , 145).

For example, when a voltage is applied on the wordline (131), the voltage generates currents flowing to the bitlines (141, 143, . . . , 145) through the memristors (111, 121, . . . ) respectively. The contributions from the voltage applied on the wordline (131) to the currents in the bitlines (141, 143, . . . , 145) are proportional to weights and responses of neurons to the input represented by the voltage applied on the wordline (131). The weights and responses of neurons can be implemented via programming the resistances of the memristors (111, 121, . . . ) respectively.

The bitlines (141, 143, . . . , 145) sum the electric currents contributed from the voltages applied on the wordlines (131, . . . , 133, 135, . . . , 137) to the bitlines (141, 143, . . . , 145). Thus, the currents in the bitlines (141, 143, . . . , 145) correspond to the summation of the multiplications of the weights and responses of neurons, implemented via the programmed resistances of the crossbar array (101), with the voltages of the wordlines (131, . . . , 133, 135, . . . , 137) that represent the input to the neurons.

For example, the contributions of the voltages on the wordlines (131, . . . , 133, 135, . . . , 137) to the bitline (141) are summed via the currents flowing from the wordlines (131, . . . , 133, 135, . . . , 137) through the memristors (111, . . . , 113, 115, . . . , 117) to the bitline (141); and the contributions of the voltages on the wordlines (131, . . . , 133, 135, . . . , 137) to the bitline (143) are summed via the currents flowing from the wordlines (131, . . . , 133, 135, . . . , 137) through the memristors (121, . . . , 123, 125, . . . , 127) to the bitline (143); etc.

Thus, the crossbar array (101) performs Multiply-and-Accumulate (MAC) operations by converting the voltages on the wordlines (131, . . . , 133, 135, . . . , 137) to the currents on bitlines (141, 143, . . . , 145).

In FIG. 2, instead of using ADCs to measure the currents flowing through the bitlines (141, 143, . . . , 145), a memristor array (105) is used to generate current spikes based on thresholds of memristors (119, 129, . . . ) that are connected to the bitlines (141, 143, . . . ) respectively.

For example, a memristor (119) is connected to the bitline (141) and programmed to have a threshold corresponding to the threshold of activation level of a spiking neuron. When the current on the bitline (141) is less than the current threshold, the memristor (119) has a first resistance corresponding to a switch-off state; and when the current on the bitline (141) has reached the current threshold, the memristor (119) has a second resistance corresponding to a switch-off state, which is significantly lower than the first resistance.

A current level detector (151) is configured to detect whether or not the current on the bitline (141) is at a level corresponding to the switch-on state of the memristor (119), which indicates whether or not a spike is produced by a spiking neuron corresponding to the bitline (141).

Thus, the outputs of the current level detectors (151, 153, . . . , 155) correspond to the output spikes (109) of the bitlines (141, 143, . . . , 145).

For example, a spike train can be applied on the wordline (131). The spike train is a time sequence of the voltages applied on the wordline (131). Voltages in the spike train can be scheduled at a fixed time interval. The voltages in the spike train can be selected from two predetermined voltages. One of the voltages corresponds to the presence of a spike at a time instance in the spike train; and the other corresponds to the absence of a spike at a time instance in the spike train.

For example, a data item containing a number of bits can be converted into a spike train on the same number of time instances. The voltage applied at each of the time instances is based on the value of the corresponding bit in the data item.

When a set of spike trains are applied to the set of wordlines (131, ..., 133, 135, ..., 137) respectively, the outputs of the current level detectors (151, 153, ..., 155) generate a set of output spike trains, which can be further processed by another tile of spiking neural network.

The resistance values of the memristors in the crossbar array (101) can be set to model the behavior of a spiking neural network. The resistance values of the memristors in the crossbar array (101) can be changed via programming the memristors by selectively applying currents and/or voltages. For example, after a memristor (e.g., 111) is selected for programming, a voltage applied on the memristor (e.g., 111) can be raised to place the memristor (e.g., 111) in a switch-on state; and then programming pulses can be applied on the memristor (e.g., 111) to adjust the resistance of the memristor (e.g., 111) to a desired value. After the programming, the memristor (e.g., 111) remembers its programmed resistance during its switch-off state, until the memristor (e.g., 111) is again selected for programming under the switch-on state. A separate circuit can be used to select memristor (e.g., 111) and program the resistance of the memristor (e.g., 111).

Figure 3:
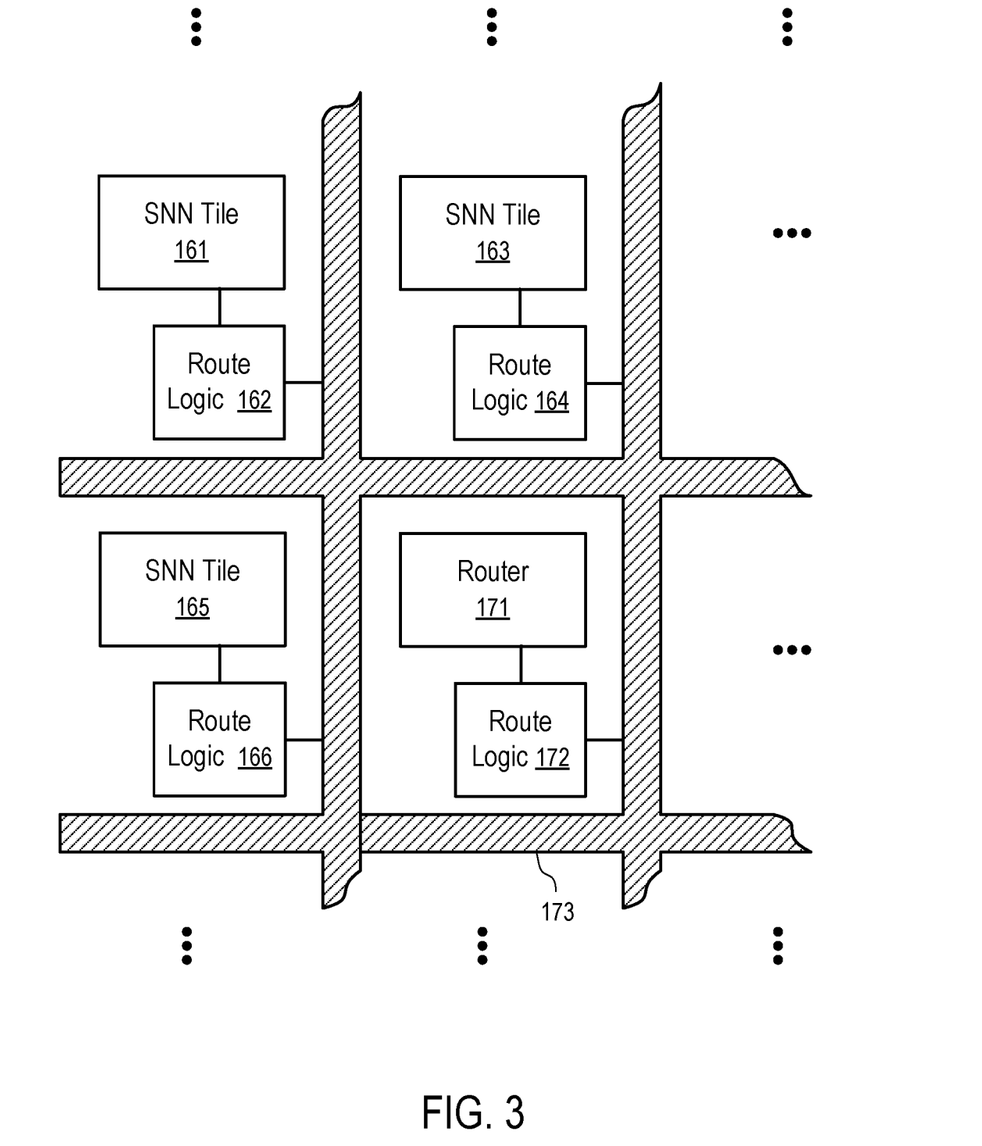
FIG. 3 illustrates a spiking neural network implemented using a network of spiking neural network tiles according to one embodiment.

FIG. 3 illustrates a spiking neural network implemented using a network of spiking neural network tiles according to one embodiment.

In FIG. 3, a plurality of SNN tiles (161, 163, 165, ...) are configured on an integrated circuit die. Each SNN tile (e.g., 161, 163, or 165) can be implemented in a way illustrated in FIG. 1 and/or FIG. 2. Each SNN tile (e.g., 161, 163, or 165) has an associated route logic (e.g., 162, 164, or 166) configured to provide input spike data (e.g., 103) from a communication network (173) to the SNN tile and transmit its output spike data (e.g., 109) via the communication network (173) to other SNN tiles.

For example, each SNN tile (e.g., 161, 163, or 165) and the router (171) can have a unique address for the data transmission over the communication network (173). An input spike train address to an SNN tile (e.g., 161) is received by its route logic (e.g., 162), which generates respective voltages for the wordlines (e.g., 131, ..., 133, 135, ..., 137) of the tile (e.g., 101) to cause the tile (e.g., 101) to generate output spikes (109) via the current level detectors (e.g., 151, 153, ..., 155) connected to the bitlines (e.g., 141, 143, ..., 145) of the SNN tile (e.g., 101). The route logic (e.g., 162) then transmits the output spikes to the router (171). The router (171) is configured to route the output spikes to the next tile(s) (e.g., 163, and/or 165) according to the neural connectivity in the spiking neural network.

The router (171) is configured on the integrated circuit die to route the input/output spikes to or from the SNN tiles (e.g., 161, 163, and/or 165) (e.g., according to a routing table configured according to the neural connectivity in a spiking neural network). Thus, the SNN tiles (e.g., 161, 163, or 165) on the integrate circuit die can be re-configured via the router (171) to model different spiking neural networks of different neuron connectivity configurations.

Figure 4:
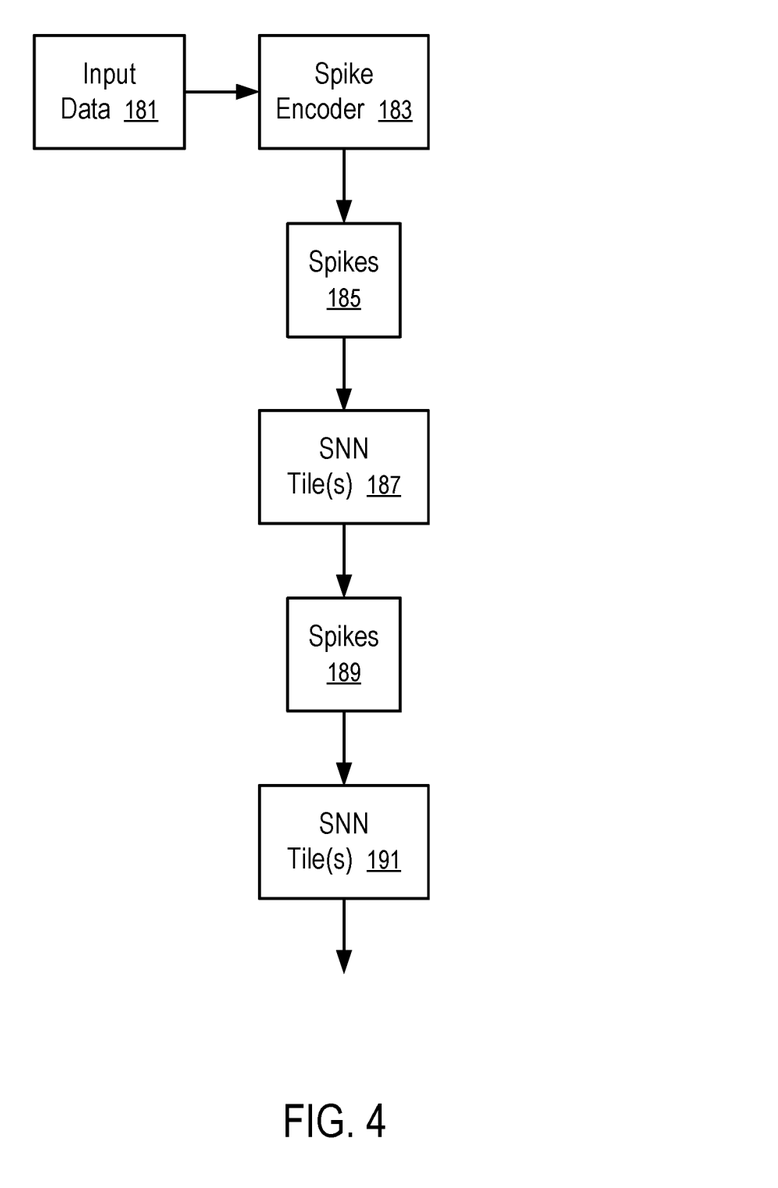
FIG. 4 illustrates the processing of a spiking neural network by detecting spikes using memristors and routing the detected spikes among memristor tiles.

FIG. 4 illustrates the processing of a spiking neural network by detecting spikes using memristors and routing the detected spikes among memristor tiles.

In FIG. 4, input data (181) to a spiking neural network is converted by a spike encoder (183) to generate spikes (185) as inputs to one or more SNN tiles (187). Each of the SNN tiles (187) can be implemented in a way illustrated in FIG. 1 or FIG. 2, where the output spikes in electronic currents in the bitlines (e.g., 141, 143, ..., 145) are detected via an array (105) of memristors having thresholds configured according to the thresholds of the activation levels of spiking neurons. The current level detectors (151, 153, ..., 155) generate digital data of output spikes (109) that can be provided as input spikes (189) to further SNN tile(s) (191). Further layers of SNN tiles can be added in a way similar to the use of the second layer of tiles (191).

The tiles (e.g., 187 and 191) used in FIG. 4 can be the tiles (161, 163, 165, ...) configured on an integrated circuit die. Some of the tiles (161, 163, 165, ...) on the integrated circuit die can be reconfigured to model different portions of spiking neurons in a network at different times.

For example, the first layer of SNN tiles (187) can be initially configured on the tiles (161, 163, 165) by programming the resistance of the memristors (e.g., 111 to 117, 121 to 127, ...) in the crossbar array (101) of each tile (e.g., 101) and by programming the thresholds of the memristors (e.g., 119, 129, ...) for spike detection. Subsequent, some of the tiles (161, 163, 165) can be reprogrammed as the SNN tiles (191) for the second layer processing.

Figure 5:
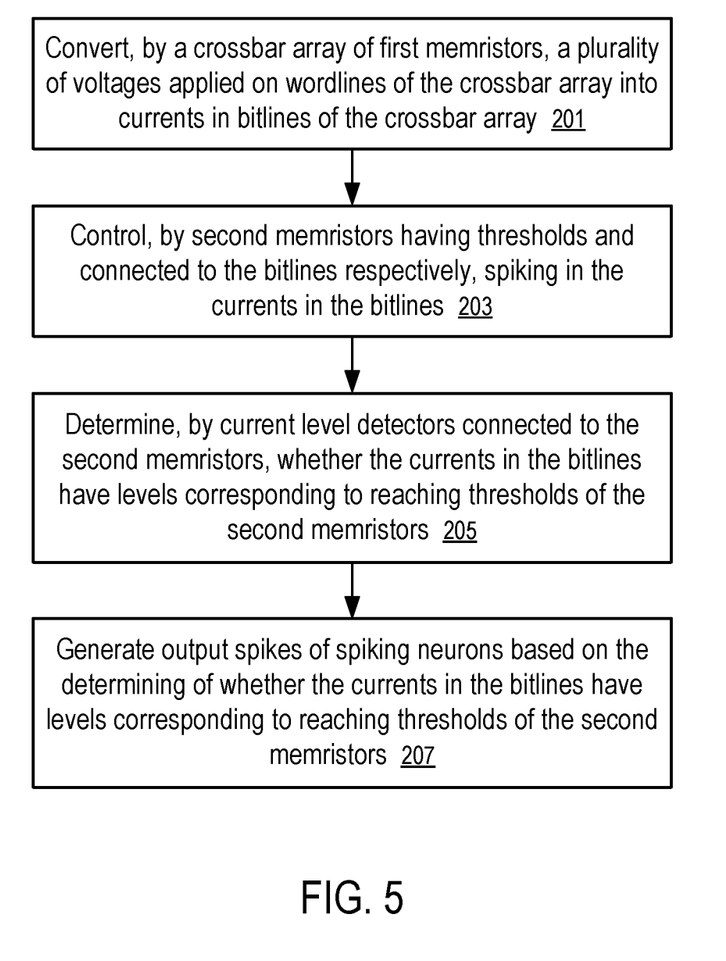
FIG. 5 shows a method to implement a spiking neural network according to one embodiment.

FIG. 5 shows a method to implement a spiking neural network according to one embodiment. For example, the method of FIG. 5 can be implemented in an integrated circuit illustrated in FIG. 1, FIG. 2, and/or FIG. 3, in connection with the processing flow of FIG. 4.

At block 201, a crossbar array (101) of first memristors (e.g., 111 to 117, 121 to 127, ...) can convert a plurality of voltages applied on wordlines (e.g., 131, ..., 133, 135, ..., 137) of the crossbar array (101) into currents in bitlines (e.g., 141, 143, ..., 145) of the crossbar array (101).

At block 203, second memristors (e.g., 119, 128, ...), having thresholds and connected to the bitlines (e.g., 119, 129, ...) respectively, control spiking in the currents in the bitlines (e.g., 119, 129, ...).

For example, each respective memristor in the second memristors (e.g., 119, 129, ...) can substantially reduce its electrical resistance to cause spiking in the electric current flowing through the respective memristor once the electric current increases to reach the threshold of the respective memristor At block 205, current level detectors (e.g., 151, 153, ..., 155) connected to the second memristors (e.g., 119, 129, ...) determine whether the respective currents in the bitlines (e.g., 141, 143, ..., 145) have levels corresponding to reaching the respective thresholds of the second memristors (e.g., 119, 129, ...).

For example, the electric current in the memristor (119) reaches its threshold, the electrical resistance of the memristor (119) reduces substantially to enter a switch-on state, causing the electric current to increase and spike. The current level detector (151) detects the increase and spike and generate a digital signal representing a spike.

At block 207, the current level detectors (e.g., 151, 153, ..., 155) generates output spikes (109) of spiking neurons based on the determining of whether the currents in the bitlines (e.g., 141, 143, ..., 145) have levels corresponding to reaching thresholds of the second memristors (e.g., 119, 129, ...).

Since the digital signals of the output spikes (109) are generated based on the detection of predetermined current levels that corresponding to reaching thresholds of the second memristors (e.g., 119, 129, . . . ), data representing the output spikes (109) can be generated without using an analog-to-digital converter to measure the electric currents in the bitlines (e.g., 141, 143, . . . , 145).

For example, the thresholds of the second memristors (e.g., 119, 129, . . . ) can be programmed according to activation level thresholds of spiking neurons implemented using the first memristors (e.g., 111 to 117, 121 to 127, . . . ) in the crossbar array. The resistances of the first memristors (e.g., 111 to 117, 121 to 127, . . . ) according to spiking neurons implemented using the first memristors (e.g., 111 to 117, 121 to 127, . . . ). The voltages on the wordlines (e.g., 131, . . . , 133, 135, . . . , 137) correspond to inputs to the spiking neurons, and the currents on the bitlines (e.g., 141, 143, . . . , 145) correspond to activation levels of the spiking neurons responsive to the inputs. The inverse of the resistance of each of the first memristors (e.g., 111) corresponds to a responsive coefficient of a spiking neuron to an input represented by the voltage applied on the wordline (e.g., 131); and the bitline (e.g., 141) sums the currents from the memristors (e.g., 111, . . . , 113, 135, . . . , 117) and thus sums the responses of the spiking neuron to different inputs (e.g., 131, . . . , 133, 135, . . . , 137) connected to the spiking neuron to provide the activation level of the spiking neuron.

A spike encoder (183) can be used to generate input spikes (103 or 185) from input data (181). The voltages on the wordlines (e.g., 131, . . . , 133, 135, . . . , 137) of the crossbar array (101) can be applied according to the input spikes (103).

For example, an input for the wordline (e.g., 131) can be in the form of a spike train that specifies the presence or absence of a spike at a plurality of time instances. The plurality of time instances can be separated by a predetermined, fixed time interval. At each of the time instance, the spike train indicates whether a spike is present or not. If a spike is present, a first voltage (e.g., a positive high voltage) is applied on the wordline (e.g., 131); if no spike is present, a second voltage (e.g., ground or a positive low voltage) is applied on the wordline (e.g., 131).

Similarly, the output data from a tile can identify a plurality of spike trains generated by the spiking neurons implemented by the tile. Each of the output spike trains identifies the presence or absence of a spike in a bitline (e.g., 141, 143, . . . , 145) at a plurality of time instances.

A digital communication network and a plurality of tiles can be configured on an integrated circuit die. Each tile can be used to implement a set of spike neurons corresponding to the bitlines (e.g., 141, 143, . . . , 145) in the tile. Each tile can have a crossbar array of memristors and route logic (e.g., 162, 164, or 166) to receive input data specifying voltages to be applied to one the wordlines (e.g., 131, . . . , 133, 135, . . . , 137) and to provide output data representing the output spikes (109) corresponding to spiking status of the electric currents in the bitlines (141, 143, . . . , 145).

A router (171) can be configured on the integrated circuit die to route spike trains among the tiles over the digital communication network (173).

The present disclosure includes methods and apparatuses which perform the methods described above, including data processing systems which perform these methods, and computer readable media containing instructions which when executed on data processing systems cause the systems to perform these methods.

An integrated circuit implementing a spiking neural network (SNN) can be used in a data processing system.

A typical data processing system may include an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other types of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in the same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, Read Only Memory (ROM), Random Access Memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine-readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An integrated circuit, comprising:
   a crossbar array of first memristors having wordlines and bitlines, the first memristors configured to convert voltages applied on the wordlines into currents in the bitlines;
   second memristors connected to the bitlines respectively, the second memristors configured to control spiking in the currents in the bitlines, wherein the second memristors have thresholds respectively, and wherein each respective memristor in the second memristors reduces a resistance of the respective memristor to cause spiking in a current flowing through the respective memristor when the current reaches a threshold of the respective memristor; and
   current level detectors connected to the second memristors and configured to determine whether the currents in the bitlines have levels corresponding to reaching thresholds of the second memristors and generate output spikes of spiking neurons based on determining whether the currents in the bitlines have levels corresponding to reaching thresholds of the second memristors.

2. The integrated circuit of claim 1, wherein digital data representing the output spikes is generated without using an analog-to-digital converter to measure currents in the bitlines.

3. The integrated circuit of claim 2, wherein the thresholds of the second memristors are programmed according to activation level thresholds of spiking neurons.

4. The integrated circuit of claim 3, wherein resistances of the first memristors are programmed according to spiking neurons.

5. The integrated circuit of claim 4, wherein each of the first memristors is connected between a respective wordline in the wordlines and a respective bitline in the bitlines to convert a voltage on the respective wordline into a portion of a current flowing through the respective bitline.

6. The integrated circuit of claim 4, further comprising:
   a spike encoder configured to generate input spikes from input data and apply the voltages on the wordlines of the crossbar array according to the input spikes.

7. The integrated circuit of claim 4, further comprising:
   a route logic coupled to a digital communication network and configured to receive input spike data and provide the digital data representing the output spikes.

8. A method, comprising:
   converting, by a crossbar array of first memristors, a plurality of voltages applied on wordlines of the crossbar array into currents in bitlines of the crossbar array;
   controlling, by second memristors connected to the bitlines respectively, spiking in the currents in the bitlines, wherein the second memristors have thresholds respectively, and wherein each respective memristor in the second memristors reduces a resistance of the respective memristor to cause spiking in a current flowing through the respective memristor when the current reaches a threshold of the respective memristor;

determining, by current level detectors connected to the second memristors, whether the currents in the bitlines have levels corresponding to reaching thresholds of the second memristors; and generating output spikes of spiking neurons based on the determining whether the currents in the bitlines have levels corresponding to reaching thresholds of the second memristors.

9. The method of claim 8, wherein digital data representing the output spikes is generated without using an analog-to-digital converter to measure currents in the bitlines.

10. The method of claim 9, further comprising:
programming the thresholds of the second memristors according to activation level thresholds of spiking neurons.

11. The method of claim 10, further comprising:
programming resistances of the first memristors according to spiking neurons.

12. The method of claim 11, wherein each respective bitline in the bitlines of the crossbar array sums currents generated by a subset of the first memristors coupled between the respective bitline and the wordlines of the crossbar array.

13. The method of claim 11, further comprising:
generating input spikes from input data; and
applying the voltages on the wordlines of the crossbar array according to the input spikes.

14. The method of claim 11, wherein the crossbar array is a first crossbar array; and the method further comprises:
transmitting the digital data representing the output spikes as input to a second crossbar array of third memristors.

15. A device, comprising:
an integrated circuit die;
a digital communication network configured on the integrated circuit die;
a plurality of tiles configured on the integrated circuit die, each of the tiles comprises:
a plurality of wordlines;
a plurality of bitlines;
first memristors, each coupled between a respective wordline in the plurality of wordlines and a respective bitline in the plurality of bitlines to convert a voltage applied on the respective wordline into a portion of a current collected in the respective bitline;
second memristors connected to the bitlines respectively, the second memristors configured to control spiking in the currents in the bitlines, wherein the second memristors have thresholds respectively, and wherein each respective memristor in the second memristors reduces a resistance of the respective memristor to cause spiking in a current flowing through the respective memristor when the current reaches a threshold of the respective memristor;
current level detectors connected to the second memristors respectively and configured to determine whether the currents in the bitlines have levels corresponding to reaching thresholds of the second memristors and generate output spikes of spiking neurons based on determining whether the currents in the bitlines have levels corresponding to reaching thresholds of the second memristors; and
route logic coupled to the digital communication network to receive input data specifying voltages to be applied on the wordlines and to provide output data representing the output spikes.

16. The integrated circuit of claim 15, wherein each of the tiles contains no analog-to-digital converter configured to measure currents in the bitlines.

17. The integrated circuit of claim 16, wherein the thresholds of the second memristors are programmed according to activation level thresholds of spiking neurons; and resistances of the first memristors are programmed according to spiking neurons.

18. The integrated circuit of claim 17, wherein the output data identifies a plurality of spike trains, each of the spike trains identifying presence or absence of a spike in a bitline at a plurality of time instances.

19. The integrated circuit of claim 17, further comprising:
a spike encoder configured to generate spike trains from input data, wherein each of the spike trains identifies presence or absence of a spike at a plurality of time instances.

20. The integrated circuit of claim 17, further comprising:
a router configured on the integrated circuit die to route spike trains among the tiles over the digital communication network.

* * * * *